(12) United States Patent
Kyung

(10) Patent No.: US 6,862,249 B2
(45) Date of Patent: *Mar. 1, 2005

(54) DEVICES AND METHODS FOR CONTROLLING ACTIVE TERMINATION RESISTORS IN A MEMORY SYSTEM

(75) Inventor: Kye-Hyun Kyung, Youngin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/777,070

(22) Filed: Feb. 13, 2004

(65) Prior Publication Data

US 2004/0179420 A1 Sep. 16, 2004

Related U.S. Application Data

(63) Continuation of application No. 10/224,632, filed on Aug. 21, 2002, now Pat. No. 6,754,132.
(60) Provisional application No. 60/330,083, filed on Oct. 19, 2001.

(51) Int. Cl.[7] ................................................. G11C 8/00
(52) U.S. Cl. ...................... 365/233; 365/148; 365/226
(58) Field of Search ................................. 365/233, 148, 365/226, 189.05, 194, 230.08

(56) References Cited

U.S. PATENT DOCUMENTS

| 4,748,426 A | 5/1988 | Stewart |
| 5,867,446 A | 2/1999 | Konishi et al. |
| 6,172,936 B1 * | 1/2001 | Kitazaki ................. 365/233 |
| 2003/0099138 A1 | 5/2003 | Kyung |

* cited by examiner

Primary Examiner—David Lam
(74) Attorney, Agent, or Firm—Volentine, Francos & Whitt, PLLC

(57) ABSTRACT

An active termination circuit is mounted in a memory circuit and includes a termination resistor which provides a termination resistance for the memory circuit, and a control circuit which receives an externally supplied active termination control signal, and which selectively switches on and off the termination resistor in response to the active termination control signal. The control circuit includes a synchronous input buffer and an asynchronous input buffer which each receive the active termination control signal, and a switching circuit which selectively outputs an output of said synchronous input buffer or an output of said asynchronous input buffer according to an operational mode of the memory circuit. The output of the switching circuit controls an on/off state of said termination resistor.

4 Claims, 15 Drawing Sheets

DEVICES AND METHODS FOR CONTROLLING ACTIVE TERMINATION RESISTORS IN A MEMORY SYSTEM

CROSS-REFERENCE TO RELATED APPLICATIONS

This application is a continuation application of application Ser. No. 10/224,632, filed Aug. 21, 2002, now U.S. Pat. No. 6,754,132 which claims priority to U.S. provisional application Ser. No. 60/330,083, filed Oct. 19, 2001.

BACKGROUND OF THE INVENTION

1. Filed of the Invention

The present invention generally relates to memory circuits and systems, and more particularly, the present invention relates to devices and methods for controlling active termination resistors which are used improve signaling characteristics in memory circuits and systems.

2. Description of the Related Art

Generally, as the bus frequency of a memory system (e.g., a memory system employing DRAM devices) increases, the signal integrity within the memory system degrades. Thus, a variety of bus topologies capable of reducing signal distortion have been developed. For example, it is known that the use of resistive terminations at either the receiver and/or transmitter sides within the memory system is an effective means for absorbing reflections and thereby improving signal performance. Resistive termination configurations of this type generally fall into one of two categories, i.e., passive termination or active termination.

FIG. 1 shows an example of a passive resistive termination in a memory system. In particular, a so-called stub series terminated logic (SSTL) standard is illustrated in which the bus of a memory system 100 is connected to termination voltages Vterm through termination resistors Rterm, and DRAM-mounted memory modules are inserted into slots having predetermined stub resistors Rstub. In this case, the stub resistors Rstub are not mounted on the DRAM chips, and accordingly, the example here is one of an "off-chip" passive resistive termination.

When used in a double data rate (DDR) memory system, the passive resistive termination of the SSTL standard is capable of ensuring a data rate of about 300 Mbps. However, any increase in data rate beyond 300 Mbps tends to degrade signal integrity by increasing the load of the bus having the resistive stubs. In fact, a data rate of 400 Mbps or greater is generally not achievable with the SSTL bus configuration.

FIG. 2 shows an example of a memory system having an active resistive termination, and in particular, an active-termination stub bus configuration. Here, each chipset for controlling the operation of the memory modules, and DRAMs mounted on the respective modules, includes an active termination resistor Rterm. The active termination resistor Rterm is mounted "on-chip" and may be implemented by complementary metal oxide semiconductor (CMOS) devices. In this memory system, active bus termination is achieved through input/output (I/O) ports mounted on the modules.

Each combination of one or more resistive elements Rterm and one or more ON/OFF switching devices in each DRAM is generally referred to herein as an "active terminator". Active terminators can take on any number of different configurations, and FIG. 3 illustrates an example of an active terminator having a center-tapped termination which is described in U.S. Pat. No. 4,748,426. in this example, the effective Rterm of the circuit can be varied between different values (e.g., 150 ohms and 75 ohms) depending on the enable/disable state of signals ON/OFF_1 and ON/OFF_2.

When a DRAM mounted in a memory module is not accessed (e.g., not read or written), the active termination resistor Rterm thereof is enabled by connecting the same to the bus to improve signal integrity. In contrast, when a DRAM is accessed (e.g., read or written), the active termination resistor Rterm thereof is disabled and disconnected from the bus to reduce load.

However, a considerable amount of time is required to enable the active termination resistors installed in the DRAM circuits in response to the active termination control signals, and when a module-interleaved write/read operation is performed, this time lapse can result in data bobbles, thereby degrading memory system performance. DRAMs which include a delay locked loop (DLL) or phase locked loop (PLL) can overcome this problem by controlling the enabling/disabling of the active termination resistor thereof in synchronization with an external clock. However, in the case where the DLL or PLL is deactivated during a power down or standby mode of a corresponding memory module, enabling/disabling of the active termination resistor cannot be controlled.

SUMMARY OF THE INVENTION

According to one aspect of the present invention, a buffer circuit is mounted in a memory circuit and includes a signal terminal, a synchronous input buffer having an input coupled to said signal terminal, an asynchronous input buffer having an input coupled to said input terminal, and a switching circuit which selectively outputs an output of said synchronous input buffer or an output of said asynchronous input buffer according to an operational mode of the memory circuit.

According to another aspect of the present invention, an active termination circuit is mounted in a memory circuit and includes a termination resistor which provides a termination resistance for the memory circuit, and a control circuit which receives an externally supplied active termination control signal, and which selectively switches on and off the termination resistor in response to the active termination control signal. The control circuit includes a synchronous input buffer and an asynchronous input buffer which each receive the active termination control signal, and a switching circuit which selectively outputs an output of said synchronous input buffer or an output of said asynchronous input buffer according to an operational mode of the memory circuit. The output of the switching circuit controls an on/off state of said termination resistor.

According to still another aspect of the present invention, an active termination circuit is mounted in a memory circuit and includes a termination resistor which provides a termination resistance for the memory circuit, a mode register which stores data indicative of an operational mode of the memory circuit, and a control circuit which receives an externally supplied active termination control signal and an output of the mode register. The control circuit includes a synchronous input buffer and an asynchronous input buffer which each receive the active termination control signal, and a switching circuit which selectively outputs an output of said synchronous input buffer or an output of said asynchronous input buffer according to the output of the mode register. The output of the switching circuit controls an on/off state of the termination resistor.

According to yet another aspect of the present invention, a memory system includes a bus line, a plurality of memory circuits coupled to the bus line, and a chip set, coupled to the bus line, which supplies a plurality of active termination control signals to the memory circuits. Each of the plurality of memory circuits includes a termination resistor and a control circuit. The control circuit receives the active termination control signal supplied to the memory circuit thereof, and selectively switches on and off the termination resistor in response to the active termination control signal. Further, the control circuit includes a synchronous input buffer and an asynchronous input buffer which each receive the active termination control signal, and a switching circuit which selects one of an output of the synchronous input buffer or an output of the asynchronous input buffer according to an operational mode of the memory circuit containing the buffer circuit. The output of the switching circuit controls an on and off state of the termination resistor.

According to another aspect of the present invention, a memory system includes a bus line, a plurality of memory circuits coupled to the bus line, and a chip set, coupled to said bus line, which supplies a plurality of active termination control signals to the memory circuits. Each of the plurality of memory circuits includes a termination resistor, a control circuit, and a mode register which stores data indicative of an operational mode of the memory circuit. The control circuit includes a synchronous input buffer and an asynchronous input buffer which each receive the active termination control signal, and a switching circuit which selects one of an output of the synchronous input buffer or an output of said asynchronous input buffer according to the data of the mode register. The output of the switching circuit controls an on/off state of the termination resistor.

According to another aspect of the present invention, a method for controlling an operation of a memory circuit includes applying an input signal to a synchronous input buffer and to an asynchronous input buffer of the memory circuit, and selectively outputting an output of the synchronous input buffer or an output of the asynchronous input buffer according to an operational mode of the memory circuit.

According to a further aspect of the present invention, a method of controlling an on/off state of a termination resistor of a memory circuit includes supplying an active termination control signal to both a synchronous input buffer and an asynchronous input buffer of the memory circuit, selecting an output of the synchronous input buffer when the memory circuit is in an active operational mode, and selecting an output of the asynchronous input buffer when the memory circuit is in a standby or power-down operational mode, and setting an on/off state of the termination resistor according to the selected one of the output of the synchronous input buffer or the output of the asynchronous input buffer.

According to a further aspect of the present invention, a method is provided for controlling a plurality of termination resistors of a respective plurality of memory circuits in a memory system, where the memory system has a plurality of memory modules connected to a data bus. Each of the memory modules for mounting at least one of the plurality of memory circuits thereto. The method includes supplying an active termination control signal to both a synchronous input buffer and an asynchronous input buffer of each of the memory circuits of each of the memory modules, selecting, in each memory circuit, an output of the synchronous input buffer when the memory circuit is in an active operational mode, and selecting an output of the asynchronous input buffer when the memory circuit is in a standby or power-down operational mode, and setting, in each memory circuit, an on/off state of the termination resistor according to the selected one of the output of the synchronous input buffer or the output of the asynchronous input buffer.

According to still another aspect of the present invention, a method is provided for controlling a plurality of termination resistors of a respective plurality of memory circuits in a memory system, where the memory system having at least a first memory module and a second memory module connected to a data bus, and each of the memory modules is for mounting at least one of the plurality of memory circuits thereto. The method includes transmitting, in response to a read/write instruction of the first memory module, an active termination control signal to the memory circuits of each of the second memory module, supplying the active termination control signal to both a synchronous input buffer and an asynchronous input buffer of each of the memory circuits of the second memory module, selecting, in each of the memory circuits of the second memory module, an output of the synchronous input buffer when the second memory module is in an active operational mode, and selecting an output of the asynchronous input buffer when the second memory module is in a standby or power-down operational mode, and setting, in each memory circuit of the second memory module, an on/off state of the termination resistor according to the selected one of the output of the synchronous input buffer or the output of the asynchronous input buffer.

BRIEF DESCRIPTION OF THE DRAWINGS

The features and advantages of the present invention will become more readily apparent from the detailed description that follows, with reference to the accompanying drawings, in which.

DETAILED DESCRIPTION OF THE PREFERRED EMBODIMENTS

Figure 1:
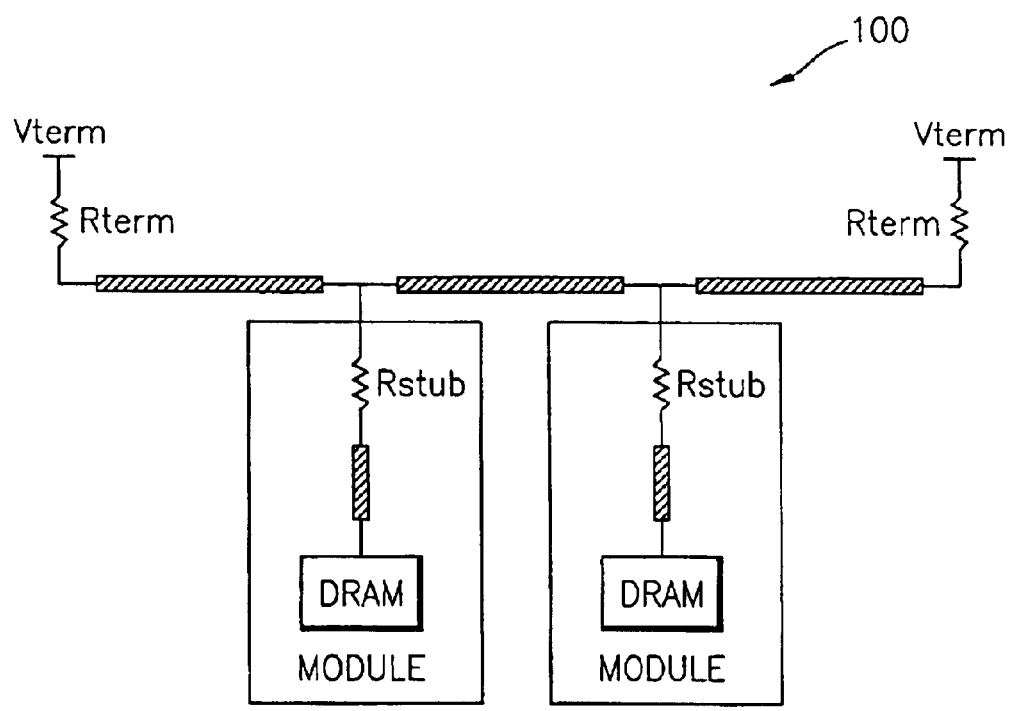
FIG. 1 shows a memory system having a conventional stub series terminated logic (SSTL) configuration.
Figure 2:
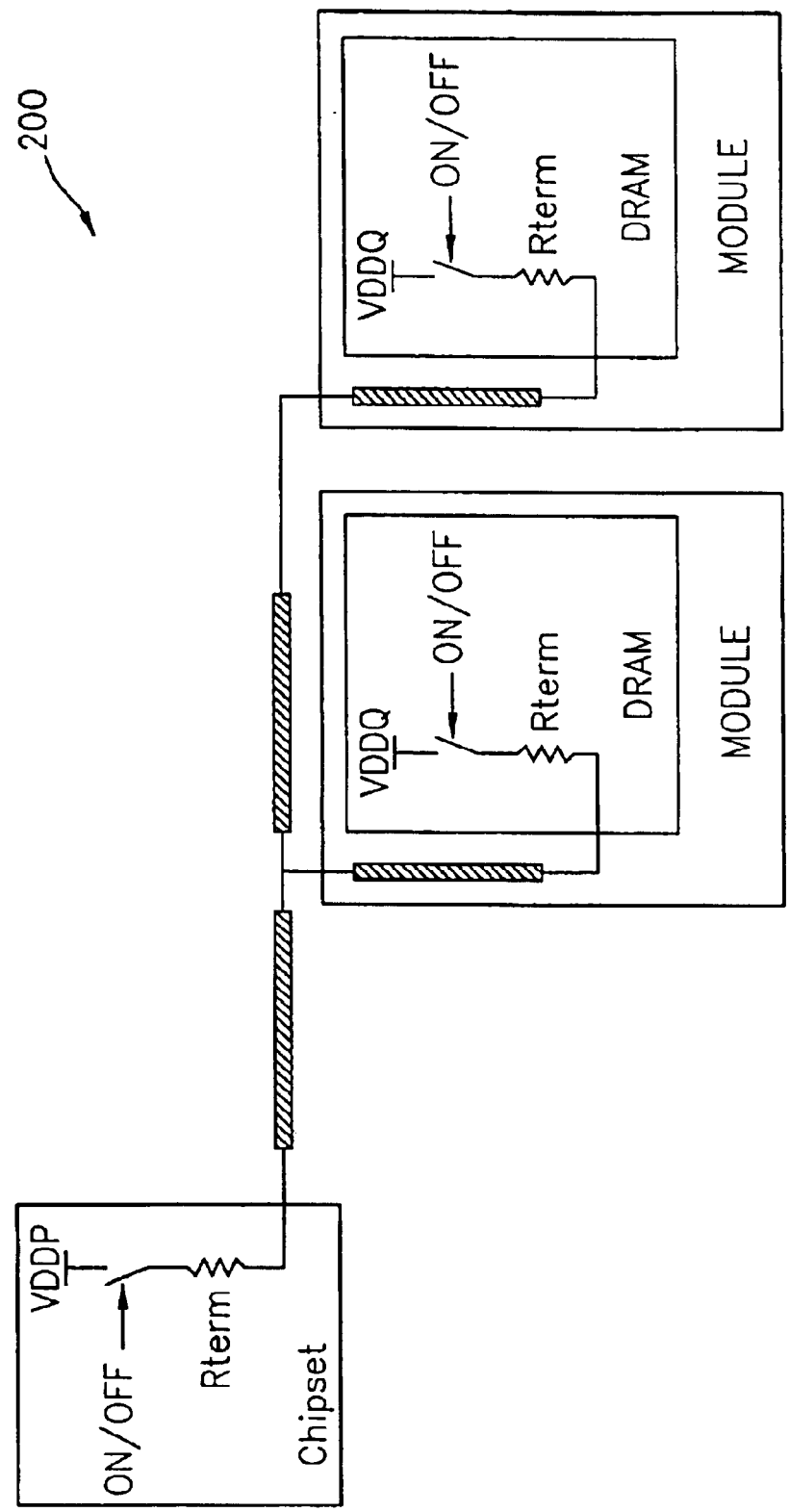
FIG. 2 shows a memory system having a conventional active-termination stub bus configuration.
Figure 3:
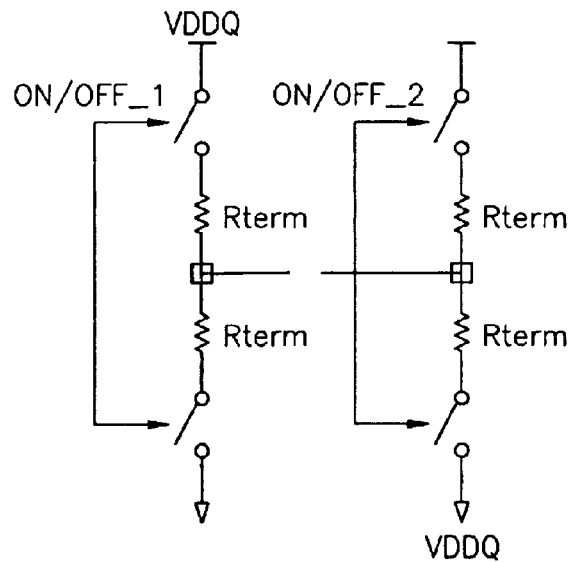
FIG. 3 illustrates an example of a conventional active terminator having a center-tapped termination.
Figure 4:
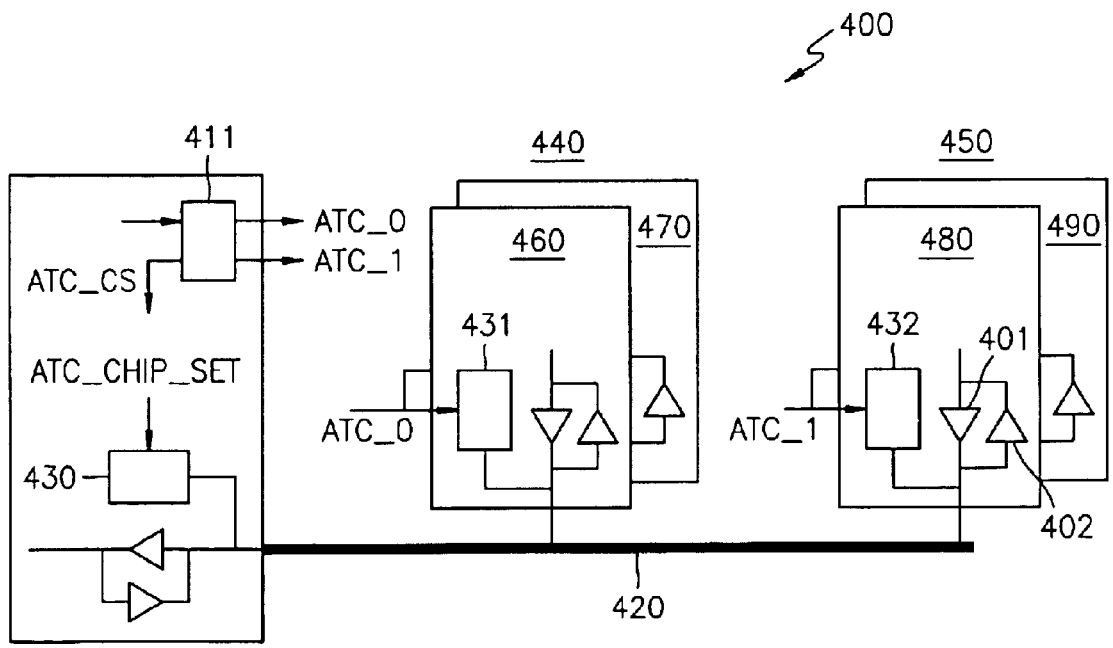
FIG. 4 shows a memory system according to an embodiment of the present invention having an active-termination stub bus configuration.

FIG. 4 shows a preferred embodiment of a memory system 400 according to an embodiment of the present invention in which an active-termination stub bus configuration is employed. Referring to FIG. 4, the memory system 400 includes a chipset 410, a data bus 420, a first memory module 440 in which DRAMs 460 and 470 are mounted, and a second memory module 450 in which DRAMs 480 and 490 are mounted. The memory modules 440 and 450 may be mounted in card slots (not shown) of the memory system 400.

The first and second memory modules 440 and 450 may be implemented, for example, by a dual in-line memory module (DiMM) or single in-line memory module (SIMM). Further, while two DRAMs (460, 470 and 480, 490) are illustrated in FIG. 4 for each of the modules 440 and 450, additional DRAMs may be mounted in each of the first and second memory modules 440 and 450. Also, each of the chip set 410 and the DRAMs 460, 470, 480 and 490 are equipped with drivers 401 and input buffers 402 for the writing and reading of data.

The chipset 410 includes an active terminator 430 which is enabled and disabled by an ATC_Chip_Set (ATC_CS) signal. In addition, each of the DRAMs 460 and 470 of the module 440 includes an active terminator 431 which is enabled and disabled by the ATC_0 signal, and each of the DRAMS 480 and 490 of the module 450 includes an active terminator 432 which is enabled and disabled by the ATC_1 signal. Further, the chipset 410 includes an ATC signal generator 411 which, as described herein below, generates the ATC_CS, ATC_1 and ATC_0 signals according to read/write modes of the memory modules 440 and 450.

Generally, when data is written to or read from the DRAMs 460 and 470, the chipset 410 outputs a data write/read command to the DRAMs 460 and 470 mounted in the first memory module 410. In addition, the chipset 410 outputs a first control signal ATC_0 to the DRAMs 460 and 470 for disabling the active terminator 431 of the DRAMs 460 and 470, and a second control signal ATC_1 for enabling the active terminators 432 of the DRAMs 480 and 490 to the DRAMs 480 and 490.

In other words, the active terminators of a memory module which is being subjected to a data write or read operation are disabled, and the active terminators of the other memory module(s) in which data is neither written nor read are enabled. In addition, however, according to the present embodiment, the active terminator is selectively asynchronously or synchronously controlled according to an operational mode of each memory module. Herein, the phrase "operation mode" refers to, for example, active, power-down and standby modes of the memory module.

"Synchronous ATC mode" refers to a mode in which the active terminator of a DRAM is enabled or disabled in synchronization with the external clock signal CLK when the DLL or PLL is activated. In other words, the termination resistors of the DRAMs are enabled or disabled in synchronization with the external clock CLK in this control mode.

"Asynchronous ATC mode" refers to a mode in which the termination resistor of a DRAM is enabled or disabled asynchronously with the external clock signal CLK when the DLL or PLL of DRAMs is deactivated (in a power down (Pdn) mode or standby (Stby) mode). In other words, the termination resistors of the DRAMs are enabled or disabled asynchronously with the external clock CLK in this control mode.

Figure 5A:
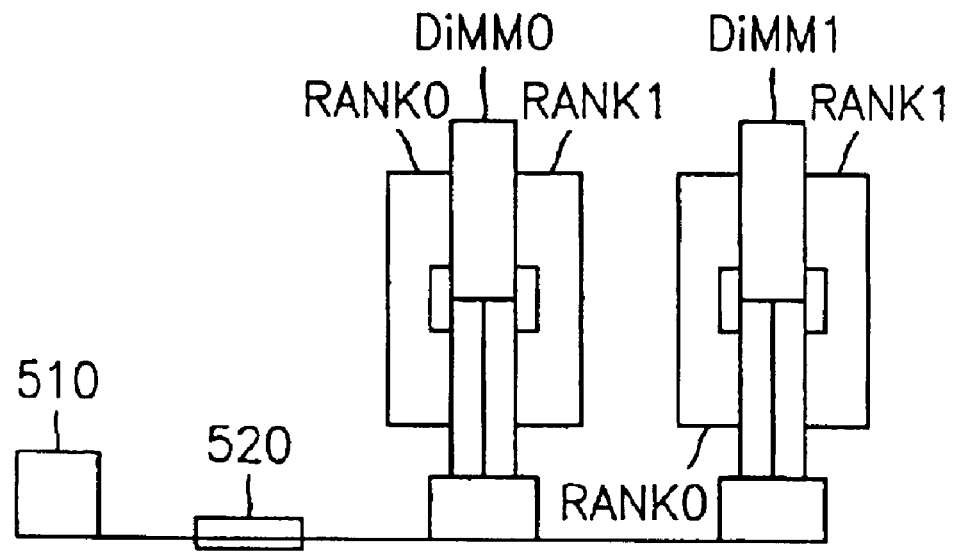
FIGS. 5A and 5B illustrate different dual in-line module (DiMM) mounting configurations according to the present invention.

For example, referring to FIG. 5A, DiMM0 and DiMM1 denote first and second dual in-line memory modules, respectively. Each module is equipped with DRAMs (rank 0 and rank 1) as shown, and is connected to a chip-set 510 by way of a data bus 520. In addition, each of the DRAMs includes a synchronization circuit for generating an internal clock in synchronization with an external clock CLK, for example, a delay locked loop (DLL) or phase locked loop (PLL). A detailed description of operation of the DLL and PLL is omitted here since these circuits are well known to those skilled in the art.

According to the present embodiment, as shown in TABLE 1 below, the active terminator of a module is asynchronously controlled when the module is in a power down or standby mode, and the active terminator of a module is synchronously controlled when the module is in an active mode. Whether a module is in an active mode, standby mode, or power down mode, may be determined from the status of the DLL or PLL of the memory module.

TABLE 1

| DLL or PLL Status | | Control Mode Of Active Terminator | |
| --- | --- | --- | --- |
| DiMM0 | DiMM1 | DiMM0 | DiMM1 |
| Active | Active | Sync. Control | Sync. Control |
| Active | Pdn/stby | Off | Async. Control |
| Pdn/stby | Active | Async. Control | Off |
| Pdn/stby | Pdn/stby | Off | Off |

As such, when both DiMM0 and DiMM1 are in an active state, the active terminator of both modules is synchronously controlled. On the other hand, when one of the modules is in a power down or standby mode (Pdn/stby) while the other is in an active mode, the active terminator of the one module is asynchronously controlled. In this manner, the enabling/disabling of the active terminator can be controlled in the case where the DLL or PLL is deactivated during a power down or standby mode of a corresponding memory module. Accordingly, it not necessary to first activate the DLL or PLL prior to initiating control of the active terminator.

Figure 5B:
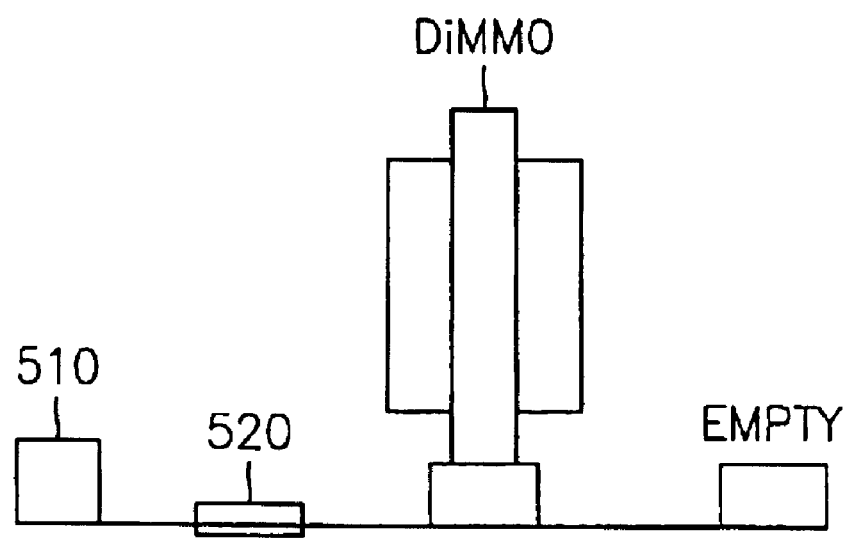

FIG. 5B illustrates the case where the DiMM1 module of the memory system is empty, and TABLE 2 below illustrates the active termination control modes in the case where either one of the DiMM0 or DiMM1 modules is empty.

TABLE 2

| DLL or PLL Status | | Control Mode Of Active Terminator | |
| --- | --- | --- | --- |
| DiMM0 | DiMM1 | DiMM0 | DiMM1 |
| Active | empty | Sync. Control | — |
| Pdn/stby | empty | Off | — |
| empty | Active | — | Sync. Control |
| empty | Pdn/stby | — | Off |

Figure 6:
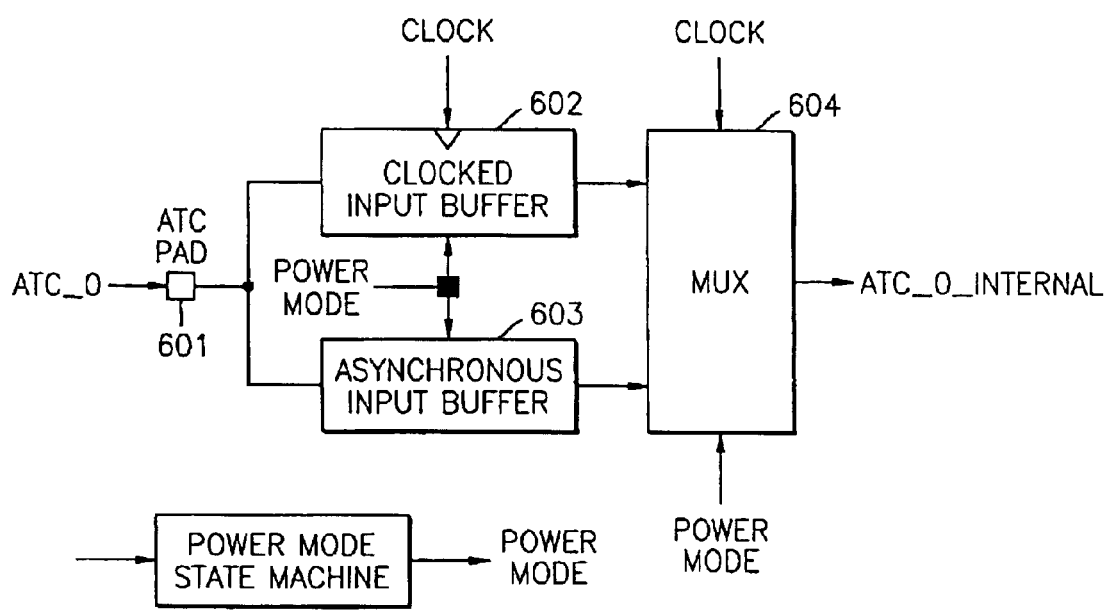
FIG. 6 illustrates an active terminator control input buffer according to the present invention.

Referring now to FIG. 6, a functional diagram of a synchronous and asynchronous active terminator control (ATC) input buffer of the present invention is shown. An ATC pad 601 receives an ATC_0 signal from the chip-set (FIG. 4). The ATC_0 signal is applied in parallel to a clocked (synchronous) input buffer 602 and an asynchronous input buffer 603. A multiplexer (MUX) 604 effectively selects one of an output of the synchronous input buffer 602 or an output of the asynchronous input buffer 603 according to an operational mode signal applied thereto. In addition, the operational mode signal, which is supplied from an operational mode state machine of the memory system, is also used to operatively enable/disable the buffers 602 and 603. The ATC control circuit of FIG. 6 operates in accordance with the TABLES 1 and 2 discussed above to selectively control the active terminators of the memory modules in either a synchronous or asynchronous mode.

Figure 7A:
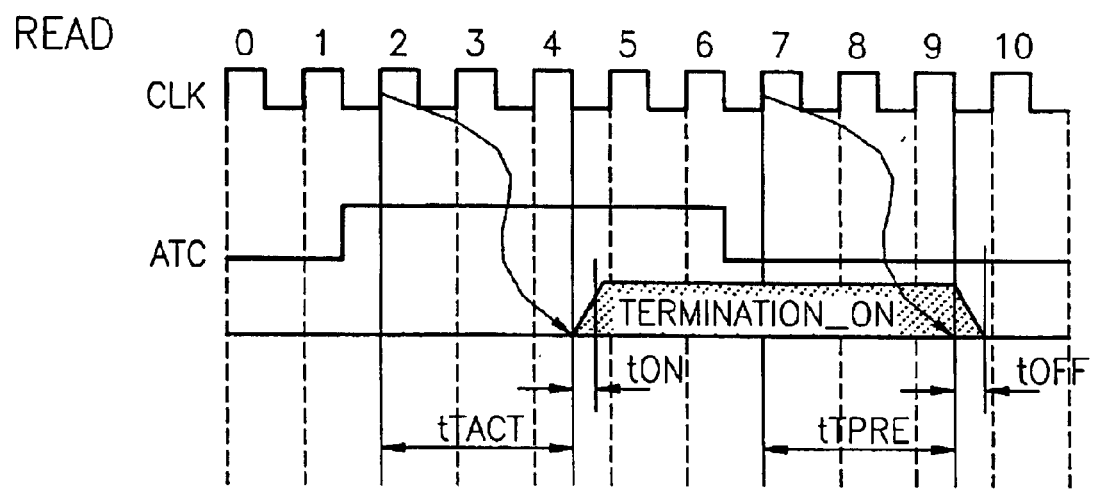
FIGS. 7A and 7B are timing diagrams of a synchronous active termination resistor control (ATC) mode during read and write operations, respectively.
Figure 7B:
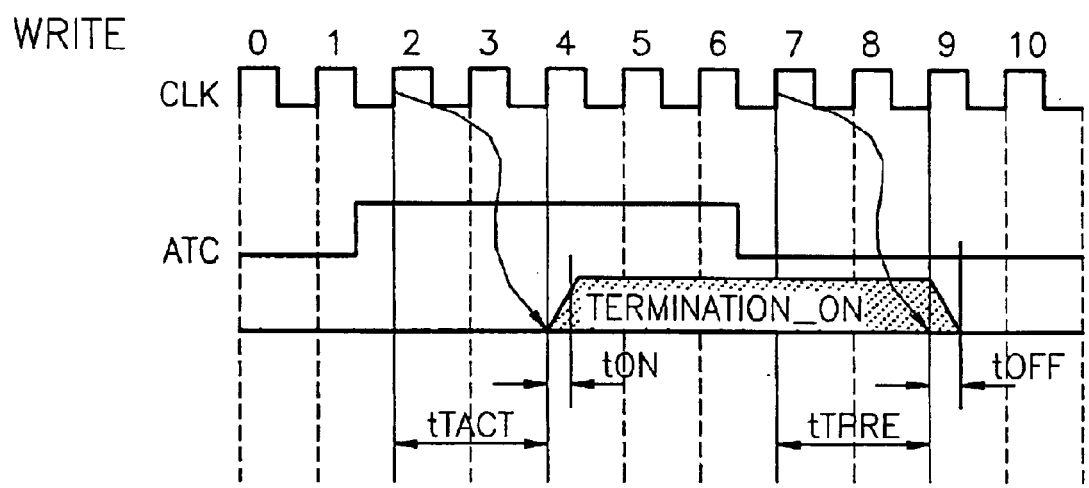

ATC control in a synchronous mode for each of a read and write operation is illustrated in the timing charts of FIGS. 7A and 7B, respectively. It is assumed here that data is written with reference to a clock center, data is read with reference to a clock edge, and that the DRAMs operate at a double data rate with a burst length of 8. The active terminators of the DRAMs are enabled preferably within a second time period tON following a first time period tTACT counted from the activation of the control signal ATC output from the chipset. The active terminators of the DRAMs are disabled preferably within a fourth time period tOFF following a third time period tTPRE counted from the deactivation of the control signal ATC. Referring first to the read operation of FIG. 7A, the ATC control is responsive at the rising edge of CLK 2 to a "high" state of the ACT signal to enable 9 the active terminator after a delay period tTACT. In this case, the enabling of the active terminator is synchronized with the falling edge of CLK 4 as shown, and the active terminator is considered to be "on" after a further delay time tON. Then, the ATC control is responsive at the rising edge of CLK 7 to a "low" state of the ACT signal to disable the active terminator after a delay period tTPRE. Again, the disabling of active terminator is synchronized with the falling edge of CLK 9 as shown, and the active terminator is considered to be "off" after a further delay time tOFF. In this example, the following relationships may be established:

2.5tCC−500 ps<tTACT, tTPRE<2.5tCC+50 ps where tTCC is a clock cycle time. Also, the time period tON and/or the time period tOFF may be set to be less than 2.5*tCC+500 ps.

Referring now to the write operation of FIG. 7B, the ATC control is responsive at the rising edge of CLK 2 to a "high" state of the ACT signal to enable the active terminator after a delay period tTACT. In this case, the enabling of the active terminator is synchronized with the rising edge of CLK 4 as shown, and the active terminator is considered to be "on" after a further delay time tON. Then, the ATC control is responsive at the rising edge of CLK 7 to a "low" state of the ACT signal to disable the active terminator after a delay period tTPRE. Again, the disabling of active terminator is synchronized with the rising edge of CLK 9 as shown, and the active terminator is considered to be "off" after a further delay time tOFF. In this example, the following relationships may be established:

2.0tCC−500 ps<tTACT, tTPRE<2.0tCC+500 ps where tTCC is a clock cycle time. Also, the time period tON and/or the time period tOFF may be set to be less than 0.5*tCC+500 ps.

Figure 8:
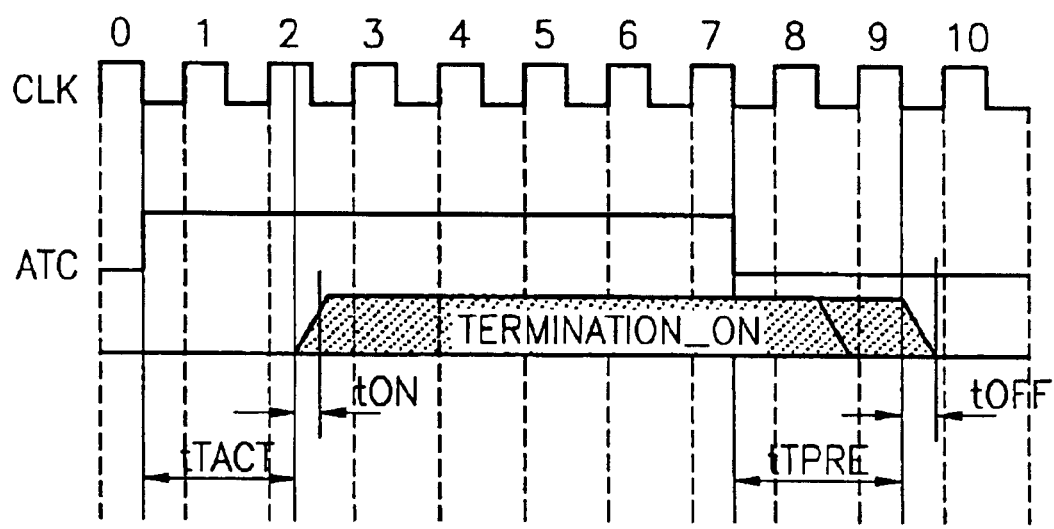
FIG. 8 is a timing diagram of an asynchronous ATC mode.

ATC control in an asynchronous mode is illustrated in the timing chart of FIG. 8. Here, the ATC control is responsive to a "high" state of the ACT signal to enable the active terminator after a delay period tTACT. Note here that the enabling of the active terminator is not synchronized with the clock signal, but is instead determined by the amount of the delay tTACT. As before, the active terminator is considered to be "on" after a further delay time tON. The ATC control is then responsive to a "low" state of the ACT signal to disable the active terminator after a delay period tTPRE. Again, the disabling of the active terminator is not synchronized with the clock signal, but is instead determined by the amount of the delay tTPRE, and the active terminator is considered to be "off" after a further delay time tON. Here, for example, tTACT and tTPRE may be set between 2.5 ns and 5.0 ns. Also, the time period tON and/or the time period tOFF may be set to be less than 0.5*tCC+500 ps.

Figure 9A:
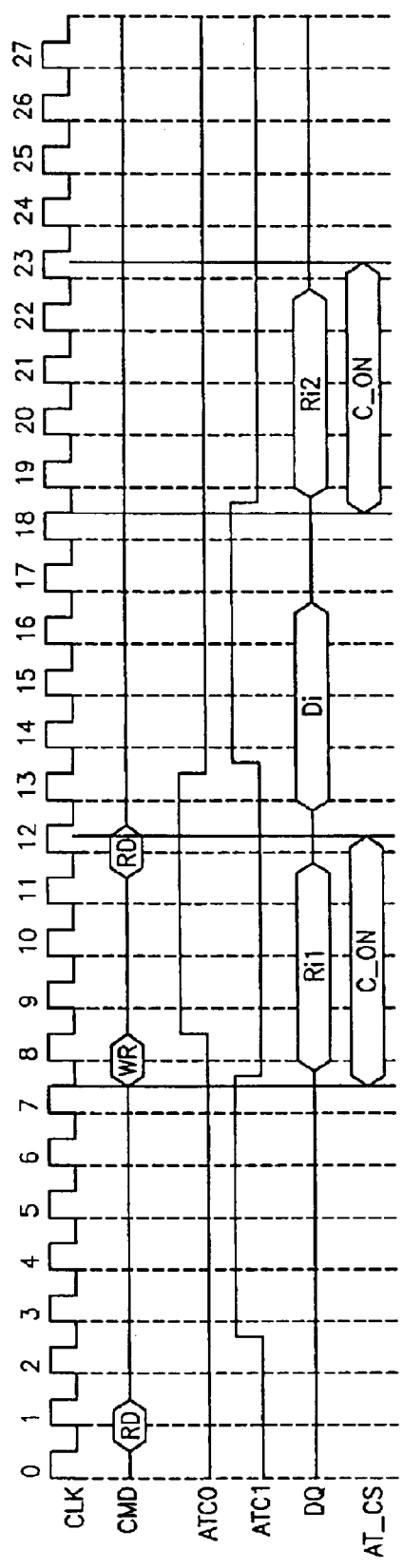
FIGS. 9A through 9C are timing charts of an operation of the memory system when both modules DiMM0 and DiMM1 are in an active mode.
Figure 9B:
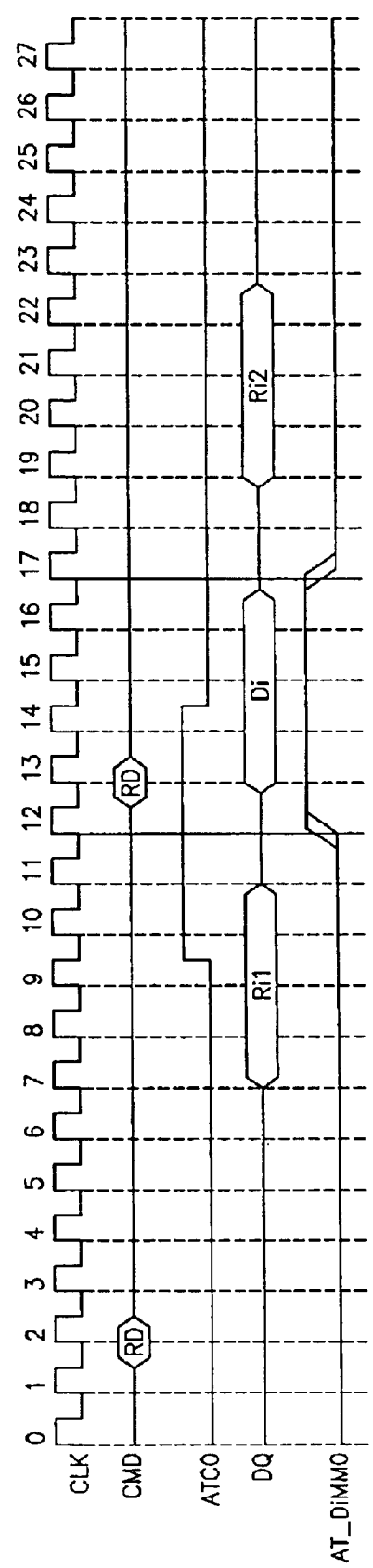
Figure 9C:
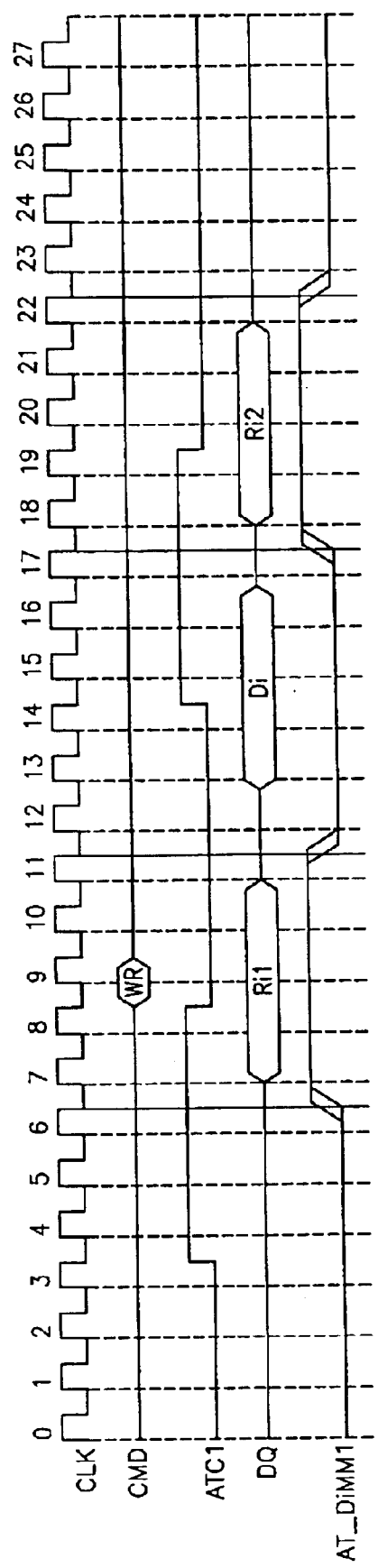

FIGS. 9A through 9C are timing charts of an operation of the memory system when both DiMM0 and DiMM1 are in an active mode. Since both modules are active, as described above in TABLE 1, the ATC control of each is carried out in a synchronous mode. FIG. 9A illustrates the operation of the chip-set, FIG. 9B illustrates the operation of the DiMM0 module, and FIG. 9C illustrates the operation of the DiMM1 module. As shown, the chip-set issues a sequence of commands including a read command RD to the DiMM0, a write command WR to the DiMM1, and another read command RD to the DiMM0. To read the DiMM0, the active terminator of the DiMM1 must be enabled. Accordingly, the first read command RD of the chip-set is followed by an ATC1 signal which is received by the DiMM1. The DiMM1 is responsive to the ATC1 signal to temporarily enable the active terminator thereof as shown by AT_DiMM1 of FIG. 9C. Also, during the period in which the active terminator of DiMM1 is enabled, data Ri1 is read from the DiMM0.

Likewise, to next write the DiMM1, the active terminator of the DiMM0 must be enabled. Accordingly, the write command WR of the chip-set is followed by an ATC0 signal which is received by the DiMM0. The DiMM0 is responsive to the ATC0 signal to temporarily enable the active terminator thereof as shown by AT_DiMM0 of FIG. 9B. Also, during the period in which the active terminator of DiMM0 is enabled, data Di is written to the DiMM1.

The second read operation of DiMM0 is carried out in the same manner as the first read operation, with the DiMM1 being responsive to the ACT1 signal to enable the active terminator thereof.

Note also in FIG. 9A that the active terminator of the chip-set is enabled only during the memory read operations. Active termination is not necessary in a write operation in the case where there is impedance matching of drivers.

Figure 10A:
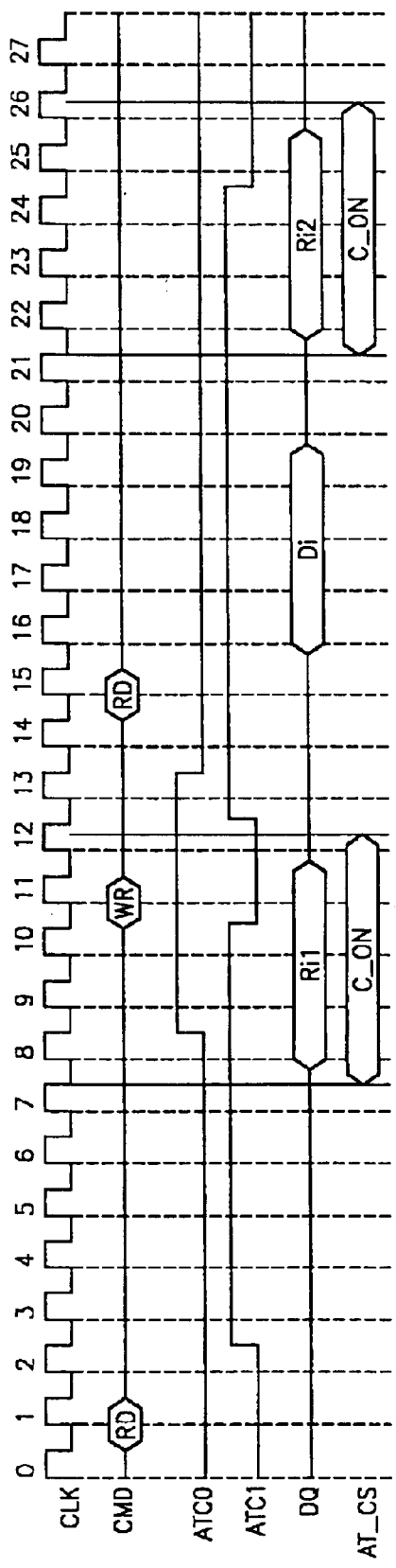
FIGS. 10A through 10C are timing charts of an operation of the memory system when the DiMM0 is in an active mode, and the DiMM1 is in a power down or standby mode.
Figure 10B:
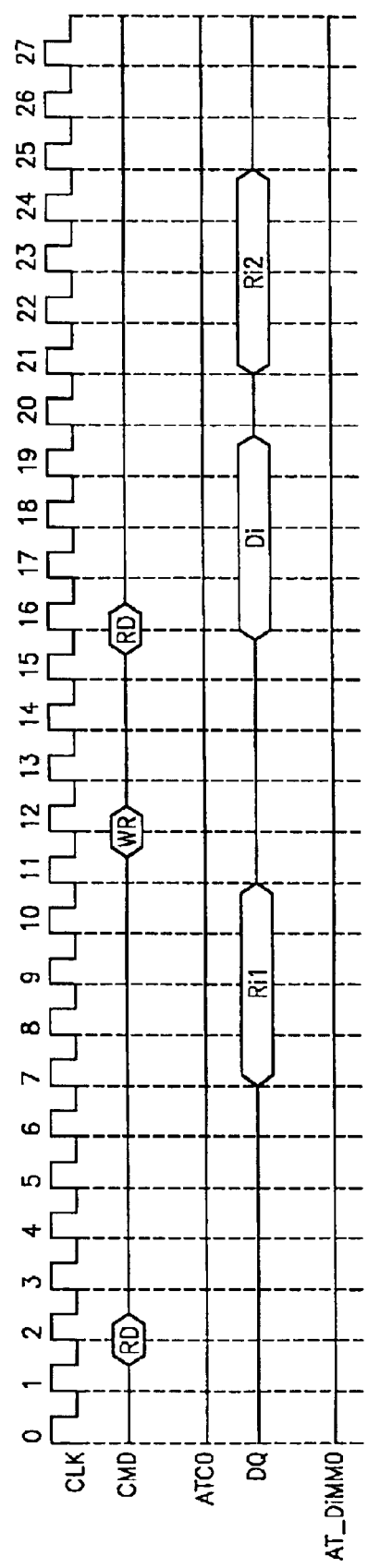
Figure 10C:
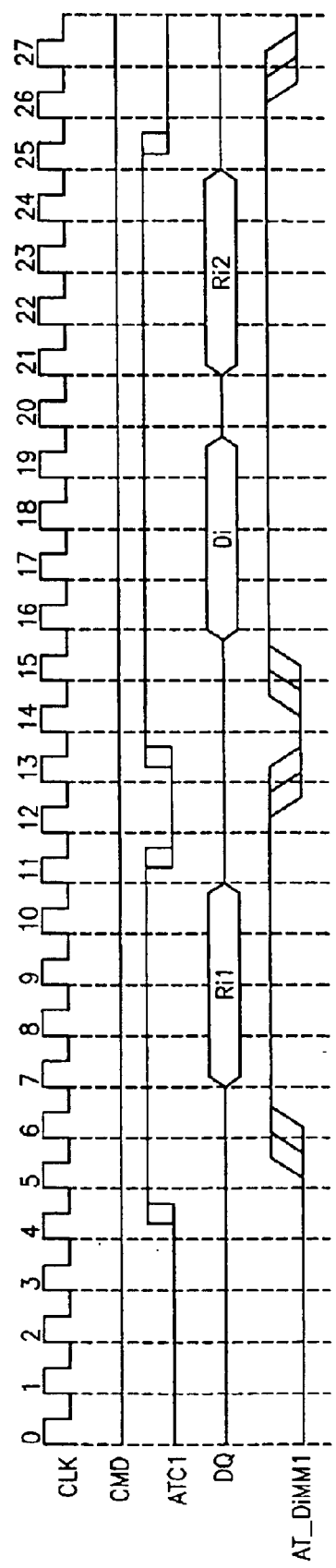

FIGS. 10A through 10C are timing charts of an operation of the memory system when the DiMM0 is in an active mode, and the DiMM1 is in a power down or standby mode. In this case, as described above in TABLE 1, the ATC control of the DiMM0 is off, and ATC control of the DiMM1 is carried out in an asynchronous mode. FIG. 10A illustrates the operation of the chip-set, FIG. 10B illustrates the operation of the DiMM0 module, and FIG. 10C illustrates the operation of the DiMM1 module. As shown, the chip-set issues a sequence of commands to the active DiMM0 module, including a read command RD to the DiMM0, a write command WR to the DiMM0, and another read command RD to the DiMM0.

To read the DiMM0, the active terminator of the DiMM1 must be enabled. Accordingly, the first read command RD of the chip-set is followed by an ATC1 signal which is received by the DiMM1. As shown, the DiMM1 is asynchronously responsive to the ATC1 signal to temporarily enable the active terminator thereof as shown by AT_DiMM1 of FIG. 10C. Also, during the period in which the active terminator of DiMM1 is enabled, data Ri1 is read from the DiMM0.

Likewise, to next write the DiMM0, the active terminator of the DiMM1 must be enabled. Accordingly, the write command WR of the chip-set is followed by another ATC1 signal which is received by the DiMM1. The DiMM0 is again asynchronously responsive to the ATC1 signal to enable the active terminator thereof as shown by AT_DiMM1 of FIG. 10C. At this time, data Di is written to the DiMM0.

In the example of FIGS. 10A through 10C, the second read command RD follows closely after the write command WR. As such, ACT1 signal remains high, and the active terminator of DiMM1 remains enabled throughout the second read operation. Note also, as is apparent from FIG. 10C, the disabling of the active terminator of the DiMM1 is asynchronous as well.

Figure 11:
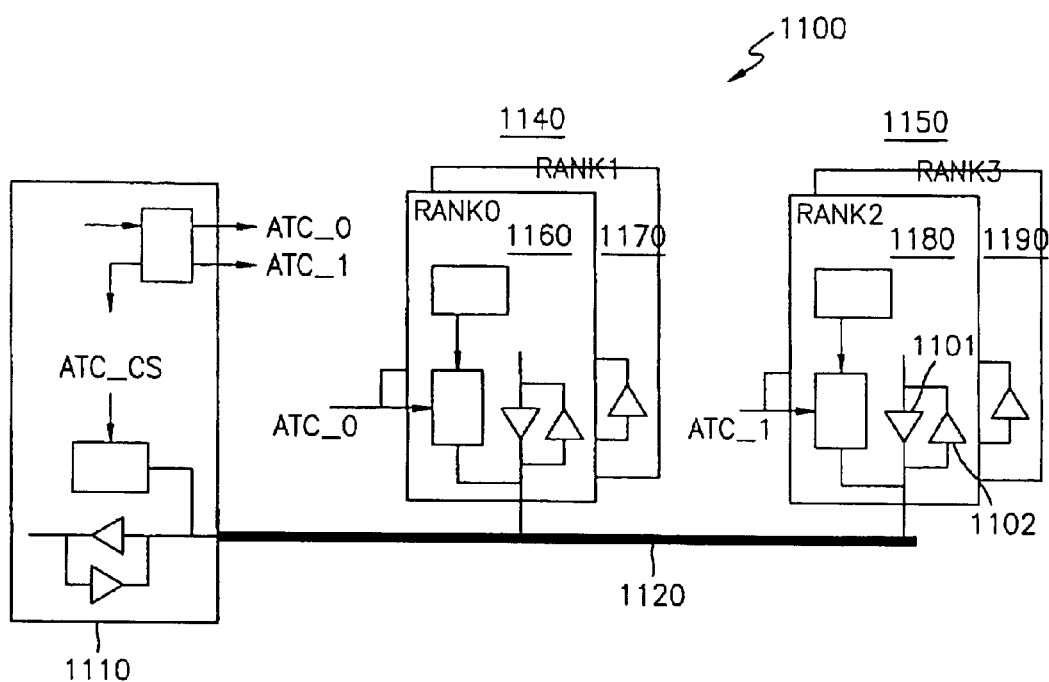
FIG. 11 shows a memory system according to another embodiment of the present invention having an active-termination stub bus configuration.

A second embodiment of the present invention will now be described with initial reference to FIG. 11 of the drawings. In this embodiment, DRAM chips positioned on each side of each DiMM module are individually ATC controlled by the combination of common ATC signaling and mode registers. In particular, as shown in FIG. 11, the memory system 1100 includes a chipset 1110, a data bus 1120, a first memory module 1140 in which DRAMs 1160 and 1170 are mounted, and a second memory module 1150 in which DRAMs 1180 and 1190 are mounted. The memory modules 1140 and 1150 may be mounted in card slots (not shown) of the memory system 1100.

The first and second memory modules 1140 and 1150 may be implemented, for example, by a dual in-line memory module (DiMM). Further, while two DRAMs (1160, 1170 and 1180, 1190) are illustrated in FIG. 11 for each of the modules 1140 and 1150, additional DRAMs may be mounted in each of the first and second memory modules 1140 and 1150. Also, each of the chipset 1110 and the DRAMs 1160, 1170, 1180 and 1190 are equipped with drivers 1101 and input buffers 1102 for the writing and reading of data.

In contrast to the first embodiment, the DRAMs 1160, 1170, 1180 and 1190 are additionally equipped with mode registers 1105 which include data indicative of the operational mode (active, power down, standby) of each corresponding DRAM. In a manner described below with reference to TABLES 3 through 7, the output of each register controls the operation of the MUX 604 of each ATC control circuit shown in FIG. 6 to thereby select a synchronous or asynchronous control mode.

Figure 12:
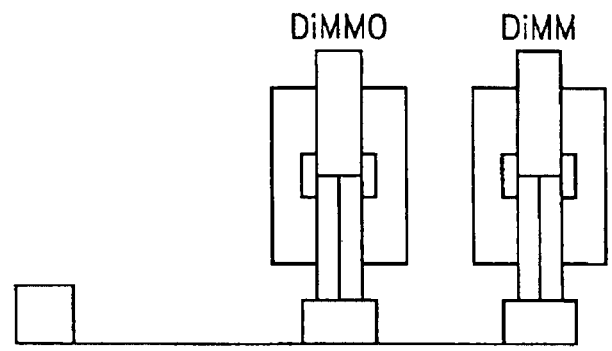
FIGS. 12–16 illustrate different dual in-line module (DiMM) mounting configurations according to the present invention.

In particular, FIG. 12 illustrates a "2r/2r" configuration in which each of DiMM0 and DiMM1 are equipped with two DRAM circuits. In this case, the active terminator control (ATC) of the memory system is carried out as shown below in TABLE 3. Here, Rank 0 (R0) designates DRAM 1160, Rank 1 (R1) designates DRAM 1170, Rank 2 (R2) designates DRAM 1,180, and Rank 3 (R3) designates DRAM 1190.

TABLE 3

| The Status of DLL or PLL | | | | Control Mode of Active Terminator | | | |
| --- | --- | --- | --- | --- | --- | --- | --- |
| R0 | R1 | R2 | R3 | R0 | R1 | R2 | R3 |
| active | active | active | active | Sync cntr | | Sync cntr | |
| active | active | active | Pdn/stby | Sync cntr | | Sync cntr | Off (flag) |
| active | active | Pdn/stby | active | Sync cntr | | Off (flag) | Sync cntr |
| active | active | Pdn/stby | Pdn/stby | Off (ATC or flag) | | Async cntr | |
| active | Pdn/stby | active | active | Sync cntr | Off (flag) | Sync cntr | |
| active | Pdn/stby | active | Pdn/stby | Sync cntr | Off (flag) | Sync cntr | Off (flag) |
| active | Pdn/stby | Pdn/stby | active | Sync cntr | Off (flag) | Off (flag) | Sync cntr |
| active | Pdn/stby | Pdn/stby | Pdn/stby | Off (ATC or flag) | | Async cntr | |
| Pdn/stby | active | active | active | Off (flag) | Sync cntr | Sync cntr | |
| Pdn/stby | active | active | Pdn/stby | Off (flag) | Sync cntr | Sync cntr | Off (flag) |
| Pdn/stby | active | Pdn/stby | active | Off (flag) | Sync cntr | Off (flag) | Sync cntr |
| Pdn/stby | active | Pdn/stby | Pdn/stby | Off (ATC or flag) | | Async cntr | |
| Pdn/stby | Pdn/stby | active | active | Async cntr | | Off (ATC or flag) | |
| Pdn/stby | Pdn/stby | active | Pdn/stby | Async cntr | | Off (ATC or flag) | |
| Pdn/stby | Pdn/stby | Pdn/stby | active | Async cntr | | Off (ATC or flag) | |
| Pdn/stby | Pdn/stby | Pdn/stby | Pdn/stby | Off (ATC or flag) | | Off (ATC or flag) | |

"Off (flag)" means that the termination resistors are disabled exclusively by the setting of the flag, and "Off (ACT or flag)" means that the termination resistors are disabled selectively by the user's setting of the control signal or the flag.

When the mode registers indicate that all ranks are active, both the DiMM0 and the DiMM1 are operated in a synchronous ATC mode. On the other hand, for example, when R3 is in a pdn/stby mode, ATC control of R3 is turned off (or flagged) and the remaining ranks R0 through R2 are operated in a synchronous ATC mode. Further, when both R2 and R3 are in an pdn/stby mode, then ATC control of DiMM0 is turned off, and the ranks R2 and R3 of DiMM1 are operated in an asynchronous ATC mode.

Figure 13:
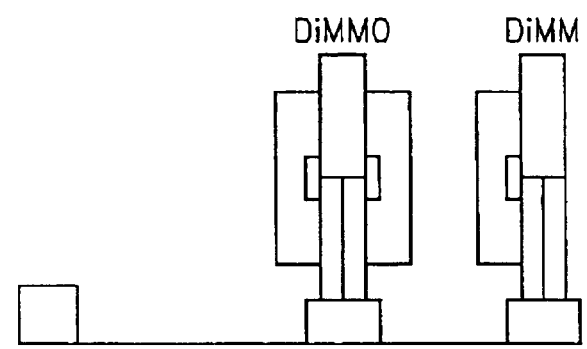

FIG. 13 illustrates a "2r/1r" configuration in which DiMM0 is equipped with two DRAM circuits and DiMM1 is equipped with one DRAM circuit. In this case, the active terminator control (ATC) of the memory system is carried out as shown below in TABLE 4. Here, Rank 0 (R0) designates DRAM 1160, Rank 1 (R1) designates DRAM 1170, and Rank 2 (R2) designates DRAM 1180.

TABLE 4

| The Status of DLL or PLL | | | Control Mode of Active Terminator | | |
| --- | --- | --- | --- | --- | --- |
| R0 | R1 | R2 | R0 | R1 | R2 |
| active | Pdn/stby | active | Sync cntr | | Sync cntr |
| active | Pdn/stby | Pdn/stby | Off (ATC or flag) | | Async cntr |
| active | Pdn/stby | active | Sync cntr | Off (flag) | Sync cntr |
| active | Pdn/stby | Pdn/stby | Off (ATC or flag) | | Async cntr |
| Pdn/stby | active | active | Off (flag) | Sync cntr | Sync cntr |
| Pdn/stby | active | Pdn/stby | Off (ATC or flag) | | Async cntr |
| Pdn/stby | Pdn/stby | active | Async cntr | | Off (ATC or flag) |
| Pdn/stby | Pdn/stby | Pdn/stby | Off (ATC or flag) | | Off (ATC or flag) |

Figure 14:
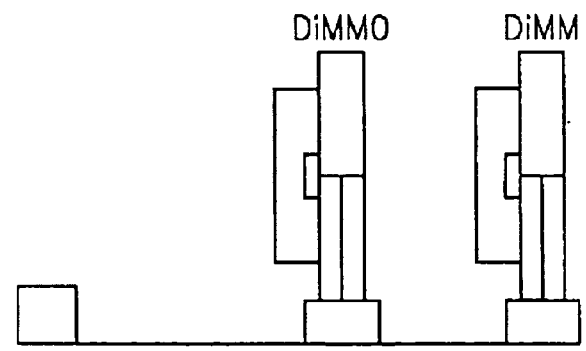

FIG. 14 illustrates a "1r/1r" configuration in which the DiMM0 is equipped with one DRAM circuit and DiMM1 is equipped with one DRAM circuit. In this case, the active terminator control (ATC) of the memory system is carried out as shown below in TABLE 5. Here, Rank 0 (R0) designates DRAM 1160 of DiMM0 and Rank 1 (R1) designates DRAM 1180 of DiMM1.

TABLE 5

| The Status of DLL or PLL | | Control Mode of Active Terminator | |
|---|---|---|---|
| R1 | R1 | R0 | R1 |
| active | active | Sync cntr | Sync cntr |
| active | Pdn/stby | Off (ATC or flag) | Async cntr |
| Pdn/stby | active | Async cntr | Off (ATC or flag) |
| Pdn/stby | Pdn/stby | Off (ATC or flag) | Off (ATC or flag) |

Figure 15:
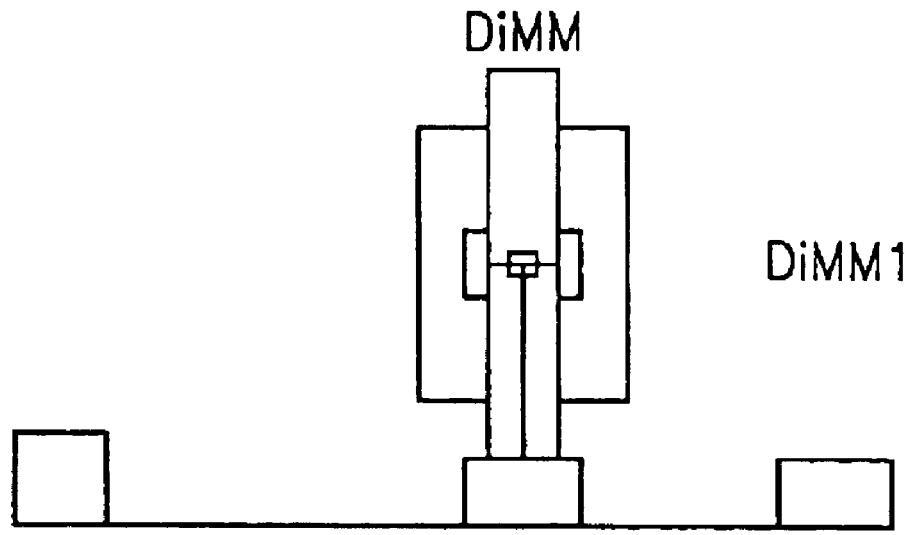

FIG. 15 illustrates a "2r/empty" configuration in which the DiMM0 is equipped with two DRAM circuits and DiMM1 is equipped with no DRAM circuits. In this case, the active terminator control (ATC) of the memory system is carried out as shown below in TABLE 6. Here, Rank 0 (R0) designates DRAM 1160 of DiMM0 and Rank 1 (R1) designates DRAM 1170 of DiMM0.

TABLE 6

| The Status of DLL or PLL | | Control Mode of Active Terminator | |
|---|---|---|---|
| R1 | R1 | R0 | R1 |
| active | active | Mod/rank (on-off) Sync cntr | |
| active | Pdn/stby | Sync cntr | Off (flag) |
| Pdn/stby | active | Off (flag) | Sync cntr |
| Pdn/stby | Pdn/stby | Off (ATC or flag) | Off (ATC or flag) |

Figure 16:
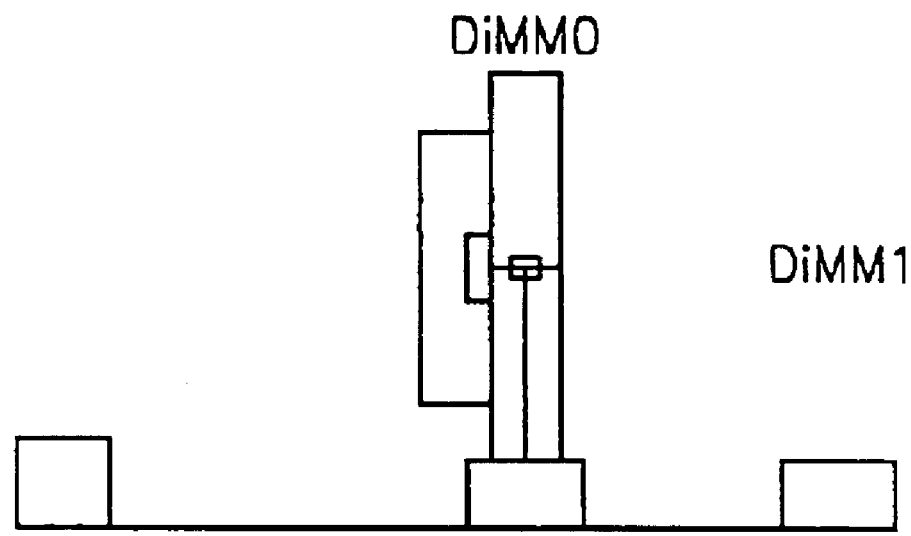

FIG. 16 illustrates a "1r/empty" configuration in which the DiMM0 is equipped with one DRAM circuit and DiMM1 is equipped with no DRAM circuits. In this case, the active terminator control (ATC) of the memory system is carried out such that when R0 is active, synchronous ATC control is carried out, and when R0 is in Pdn/sdby mode, ATC control is off. Here, Rank 0 (R0) designates the DRAM 1160 of DiMM0.

Figure 17:
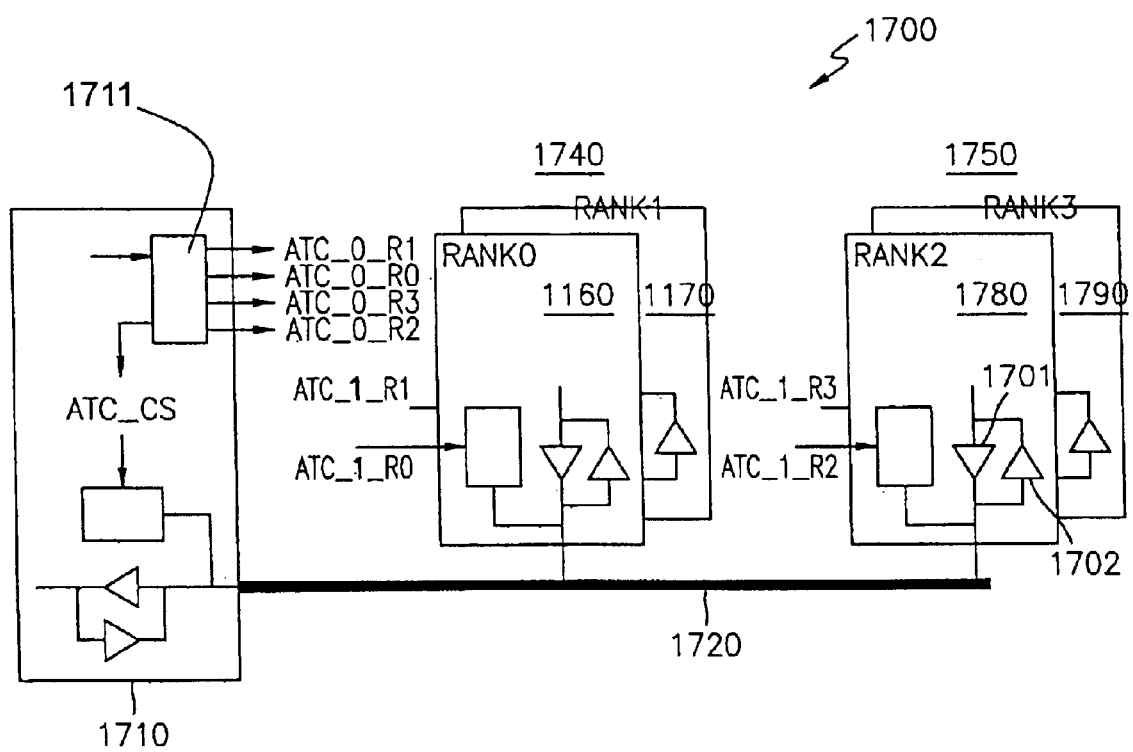
FIG. 17 shows a memory system according to still another embodiment of the present invention having an active-termination stub bus configuration.

A third embodiment of the present invention will now be described with reference to FIG. 17 of the drawings. In this embodiment, DRAM chips positioned on each side of each DiMM module are individually ATC controlled by individual ATC signals issued from the chipset. In particular, as shown in FIG. 17, the memory system 1700 includes a chipset 1710, a data bus 1720, a first memory module 1740 in which DRAMs 1760 and 1770 are mounted, and a second memory module 1750 in which DRAMs 1780 and 1790 are mounted. The memory modules 1740 and 1750 may be mounted in card slots (not shown) of the memory system 1700.

The first and second memory modules 1740 and 1750 may be implemented, for example, by a dual in-line memory module (DiMM). Further, while two DRAMs (1160, 1170 and 1180, 1190) are illustrated in FIG. 17 for each of the modules 1740 and 1750, additional DRAMs may be mounted in each of the first and second memory modules 1740 and 1750. Also, each of the chipset 1710 and the DRAMs 1760, 1770, 1780 and 1790 are equipped with drivers 1701 and input buffers 1702 for the writing and reading of data.

In contrast to the first embodiment and second embodiments, the ATC signal generator 1711 of the present embodiment supplies individual ATC signals ATC_0_R0 and ATC_0_R1 to the DRAMs 1760 and 1770 of the memory module 1140 (DiMM0), and further supplies individual ATC signals ATC_1_R2 and ATC_1_R3 to the DRAMs 1780 and 1790 of the memory module 1150 (DiMM1). In a manner described below with reference to TABLE 7, the operation of the MUX 604 of each ATC control circuit shown in FIG. 6 it controlled to thereby select a synchronous or asynchronous control mode on the basis of the operational states of each individual DRAM (or rank).

In particular, TABLE 7 corresponds to the "2r/2r" configuration of FIG. 12 in which each of DiMM0 and DiMM1 are equipped with two DRAM circuits. Here, Rank 0 (R0) designates DRAM 1760, Rank 1 (R1) designates DRAM 1770, Rank 2 (R2) designates DRAM 1780, and Rank 3 (R3) designates DRAM 1790.

TABLE 7

| The Status of DLL or PLL | | | | Control Mode of Active Terminator | | | |
|---|---|---|---|---|---|---|---|
| R0 | R1 | R2 | R3 | R0 | R1 | R2 | R3 |
| active | active | active | active | | Sync cntr | | Sync cntr |
| active | active | active | Pdn/stby | | Sync cntr | Sync cntr | Off |
| active | active | Pdn/stby | active | | Sync cntr | Off | Sync cntr |
| active | active | Pdn/stby | Pdn/stby | | Off | | Async cntr |
| active | Pdn/stby | active | active | Sync cntr | Off | | Sync cntr |
| active | Pdn/stby | active | Pdn/stby | Sync cntr | Off | Sync cntr | Off |
| active | Pdn/stby | Pdn/stby | active | Sync cntr | Off | Off | Sync cntr |
| active | Pdn/stby | Pdn/stby | Pdn/stby | | Off | | Async cntr |
| Pdn/stby | active | active | active | Off | Sync cntr | | Sync cntr |
| Pdn/stby | active | active | Pdn/stby | Off | Sync cntr | Sync cntr | Off |
| Pdn/stby | active | Pdn/stby | active | Off | Sync cntr | Off | Sync cntr |
| Pdn/stby | active | Pdn/stby | Pdn/stby | | Off | | Async cntr |
| Pdn/stby | Pdn/stby | active | active | Async cntr | | | Off |
| Pdn/stby | Pdn/stby | active | Pdn/stby | Async cntr | | | Off |
| Pdn/stby | Pdn/stby | Pdn/stby | active | Async cntr | | | Off |
| Pdn/stby | Pdn/stby | Pdn/stby | Pdn/stby | | Off | | Off |

Although the invention has been described with reference to the preferred embodiments, the preferred embodiments are for descriptive purposes only. As it will be apparent to one of ordinary skill in the art that modifications of the described embodiments may be made without departing from the spirit and scope of the invention, the scope of the appended claims is not to be interpreted as being restricted to these embodiments.

What is claimed is:

1. An active termination circuit mounted in a memory circuit, and comprising:

a termination resistor; and a control circuit which receives an externally supplied active termination control signal, and which selectively switches on and off the termination resistor in response to the active termination control signal;

wherein said control circuit comprises a first signal path for synchronizing the active termination control signal and a second signal path for asynchronously propagating the active termination control signal, and a switching circuit which selectively outputs a signal of the first or second signal paths, and wherein the output of the switching circuit controls an on/off state of the termination resistor.

2. An active termination circuit as claimed in claim 1, wherein the switching circuit is responsive to an operational mode signal to selectively output the signal of the first or second signal paths.

3. An active termination circuit mounted in a memory circuit, and comprising:

a termination resistor which provides a termination resistance for the memory circuit; and a control circuit which receives an externally supplied active termination control signal, and which is responsive to an operational mode of the memory circuit to selectively synchronously or asynchronously switch on and off the termination resistor according to the active termination control signal.

4. The active termination circuit as claimed in claim 3, wherein the control circuit synchronously switches on and off the termination resistor according to the active termination control signal when the memory circuit is in an active operational mode, and wherein the control circuit asynchronously switches on and off the termination resistor according to the active termination control signal when the memory circuit is in a standby or power-down operational mode.

* * * * *